US009203355B2

(12) United States Patent
Min

(10) Patent No.: US 9,203,355 B2
(45) Date of Patent: Dec. 1, 2015

(54) DIGITAL PREDISTORTION APPARATUS AND METHOD USING THE SUM OF ABSOLUTE INPUT SIGNALS FOR A NON-IDENTICAL NUMBER OF DELAYS

(71) Applicant: Samsung Electronics Co., Ltd., Gyeonggi-do (KR)

(72) Inventor: Tae Young Min, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/240,904

(22) PCT Filed: Oct. 4, 2012

(86) PCT No.: PCT/KR2012/008041
§ 371 (c)(1),
(2) Date: Feb. 25, 2014

(87) PCT Pub. No.: WO2013/051861
PCT Pub. Date: Apr. 11, 2013

(65) Prior Publication Data
US 2014/0225668 A1 Aug. 14, 2014

(30) Foreign Application Priority Data
Oct. 4, 2011 (KR) .................. 10-2011-0100496

(51) Int. Cl.
*H03F 1/32* (2006.01)
*H03F 3/20* (2006.01)

(52) U.S. Cl.
CPC .............. *H03F 1/3247* (2013.01); *H03F 1/32* (2013.01); *H03F 1/3258* (2013.01); *H03F 3/20* (2013.01); *H03F 2201/3227* (2013.01); *H03F 2201/3233* (2013.01)

(58) Field of Classification Search
USPC ................ 330/149; 375/296–297; 455/114.3
See application file for complete search history.

(56) References Cited

U.S. PATENT DOCUMENTS 7,847,631 B2 * 12/2010 Jiang et al. .................... 330/149
2003/0063686 A1 * 4/2003 Giardina et al. .............. 375/296

FOREIGN PATENT DOCUMENTS

KR    1020040071556    8/2004
KR    1020060024706    3/2006
(Continued)

OTHER PUBLICATIONS

PCT/ISA/237 Written Opinion issued on PCT/KR2012/008041 (pp. 4).

(Continued)

*Primary Examiner* — Hieu Nguyen
(74) *Attorney, Agent, or Firm* — The Farrell Law Firm, P.C.

(57) ABSTRACT

The present invention relates to a digital pre-distortion apparatus, including: a coefficient control unit for setting coefficients in a look-up table, the coefficients minimizing a difference of an input signal to a power amplifier and an exponentiation of the sum of a first absolute output signal having the first number of delays and a second absolute output signal having the second number of delays, for an absolute signal of an output signal of a power amplifier; an adder for receiving a first absolute input signal having the first number of delays and a second absolute input signal having the second number of delays, for an absolute signal of the input signal of the power amplifier, and outputting the sum of the first absolute input signal and the second absolute input signal; and said look-up table, connected to the adder, for outputting result values according to the set coefficients in correspondence to the sum of the first absolute input signal and the second absolute input signal.

4 Claims, 7 Drawing Sheets

(56) References Cited

FOREIGN PATENT DOCUMENTS

| KR | 1020070053729 | 5/2007 |
| WO | WO 2004086607 | 10/2004 |
| WO | WO 2007004252 | 1/2007 |

OTHER PUBLICATIONS

PCT/ISA/210 Search Report issued on PCT/KR2012/008041 (pp. 3).

* cited by examiner

DIGITAL PREDISTORTION APPARATUS AND METHOD USING THE SUM OF ABSOLUTE INPUT SIGNALS FOR A NON-IDENTICAL NUMBER OF DELAYS

TECHNICAL FIELD

The present invention relates to a digital pre-distortion apparatus and method for compensating for distortion of a power amplifier. In more particular, the present invention relates to a digital pre-distortion apparatus and method using the involution term of the sum of absolute input signals for two or more non-identical delays.

BACKGROUND ART

A digital pre-distortion apparatus is the device of compensating for the non-linearity of the power amplifier linearly by pre-distorting the digital signal input to the power amplifier. Such as pre-distortion apparatus is implemented with a digital circuit comprised of adder, multiplier, and Lookup Table (LUT) and an adaptive algorithm.

Here, the lookup table is a digital memory device with which the output signal is defined according to the input signal level and a digital circuit block appropriate for the operation of defining an output value depending on an input level.

The conventional digital pre-distortion apparatus uses multipliers for multiplying absolute value signals for the input signals having the non-identical number of delays. Typically, the use of multipliers increases the complexity of the circuit in hardware implementation. Unlike the case of using the lookup table, the conventional digital pre-distortion apparatus is disadvantageous in expandability because the same-structured multiplier has to be used repeatedly to express the sum of a plurality of terms.

DISCLOSURE OF INVENTION

Technical Problem

The present invention has been conceived to solve the above problem and aims to provide a digital pre-distortion apparatus and method capable of substituting the multiplier used in implementing the digital pre-distortion apparatus using the involution term of the absolute input signal for two or more non-identical number delays.

Solution to Problem

In order to solve the above problem, the digital pre-distortion apparatus of the present invention uses the sum of the absolute values of the delayed input signals as the input of the lookup table in order to express the term of the multiplication of the absolute values of input signals delayed as much as two or more non-identical number of delays.

In more detail, the digital pre-distortion apparatus of the present invention includes a coefficient controller which sets a lookup table with a coefficient minimizing difference between an involution of sum of a first absolute output signal having the first number of delays and a second absolute output signal having the second number of delays for an absolute signal of a power amplifier output signal and an input signal of the power amplifier, an adder which receives a first absolute input signal having the first s of delay and a second absolute input signal having the second number of delays for the absolute signal of a power amplifier input signal and outputs a sum of the first and second absolute input signals, and a lookup table which connects to the adder and outputs a result value according to the coefficient set in correspondence to the sum of the first and second absolute input signals.

Also, the digital pre-distortion method of the present invention includes sampling output signal and input signal of a power amplifier, setting a lookup table with a coefficient minimizing difference between an involution of sum of a first absolute output signal having the first number of delays and a second absolute output signal having the second number of delays for an absolute signal of a power amplifier output signal and an input signal of the power amplifier, receiving a first absolute input signal having the first number of delays and a second absolute input signal having the second number of delays for the absolute signal of a power amplifier input signal and outputting a sum of the first and second absolute input signals, and outputting a result value according to the coefficient set in correspondence to the sum of the first and second absolute input signals.

In this case, the digital pre-distortion apparatus according to an embodiment of the present invention includes a first lookup table outputting an involution of the first input signal multiplied by a first coefficient in receiving the first absolute input signal having the first number of delays to the input signal, a second lookup table outputting the involution of a second absolute input signal multiplied by a second coefficient in receiving the second absolute input signal having the second number of delays to the input signal, a first adder summing the first and second absolute input signals to output a third absolute input signal, a third lookup table outputting an involution of the third absolute input signal multiplied by a third coefficient in receiving the third absolute input signal, multipliers for multiplying the input signal to the respective signals output from the first to third lookup tables, and a second summing the signals output by the multipliers and outputs the summed result, the data included in the first and second lookup tables is determined to remove the involution signals of the first and second absolute input signals generated in involution of the third absolute input signal.

Also, the digital pre-distortion method of the present invention includes determining a coefficient for the input signal to remove the involution output for the absolute input signals in involution of the sum of the absolute input signals having at least two non-identical numbers of delays and outputting final output signal using the determined coefficient.

In this case, the determining of the coefficient is the step of determining the coefficient for the first absolute input signal having the first number of delays to the input signal, the coefficient for the second absolute input signal having the second number of delays to the input signal, and the coefficient for the third absolute input signal expressed as the sum of the first absolute input signal having the first number of delays to the input signal and the second absolute input signal having the second number of delays to the input signal, the involution term of the third absolute input signal in the coefficient term of the adaptive algorithm such as Least Square (LS), Lease Mean Square (LMS), and Recursive Least Square (RLS). In this case, since the adaptive algorithm such as Least Square (LS), Lease Mean Square (LMS), and Recursive Least Square (RLS) calculates the coefficient minimizing error among the values capable of being expressed as coefficient term, it is possible to obtain the same effect as including the term of multiplication of the first and second absolute input signals. Also, by including terms of the values cubed, to the fourth, etc. to the third absolute input signal, it is possible to obtain the same effect as including the coefficient terms for various involution combinations to the first and second absolute input signals.

Advantageous Effects of Invention

According to the present invention, it is possible to implement a digital pre-distortion apparatus with adders and lookup table while having the same output signal by modifying the operation formula of the circuitry implemented with multipliers. Using the digital pre-distortion apparatus proposed in the present invention, it is possible to increase the dimension of freedom of the digital pre-distortion.

MODE FOR THE INVENTION

Exemplary embodiments of the present invention are described with reference to the accompanying drawings in detail. The same reference numbers are used throughout the drawings to refer to the same or like parts. Detailed description of well-known functions and structures incorporated herein may be omitted to avoid obscuring the subject matter of the present invention.

Figure 1:
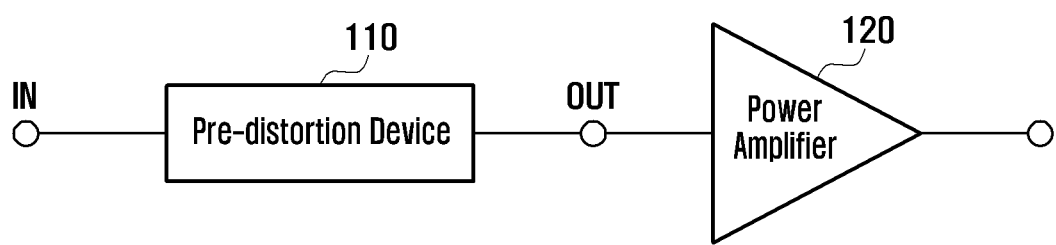
FIG. 1 is a diagram illustrating a configuration of a normal pre-distortion amplifier.

FIG. 1 is a diagram illustrating a configuration of a normal pre-distortion amplifier.

As shown in FIG. 1, the pre-distortion amplifier linearized with a pre-distortion apparatus includes a pre-distortion device 110 and a power amplifier 120.

The pre-distortion device 100 has to have the feature capable of compensating for the distortion caused by the power amplifier 120. This is because the power amplifier 120 has the feature of gain saturation (gain compression) at a power input above a certain level.

Accordingly, if the pre-distortion device 100 connected to the front end of the power amplifier has the feature of expending the gain, it is possible to improve the gain compression feature of the power amplifier 129. That is, the gain compression improvement means the improvement of the linearity of the power amplifier 120.

Figure 2:
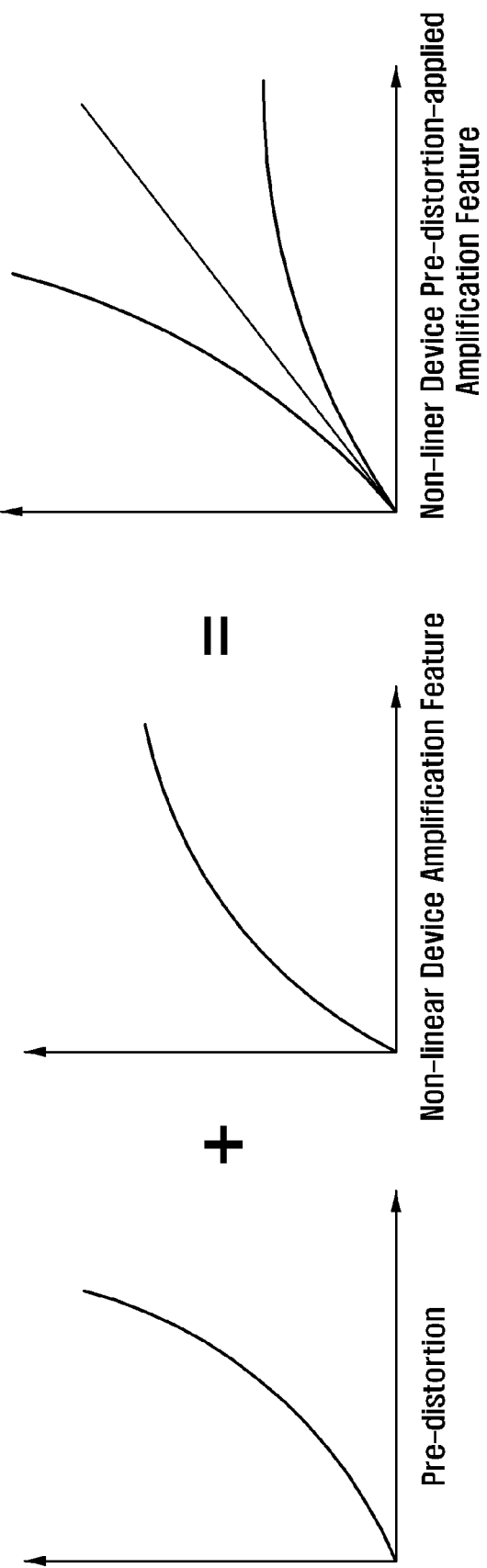
FIG. 2 is signal wave diagram illustrating a linearization process of the pre-distortion amplifier.

FIG. 2 is signal wave diagram illustrating a linearization process of the pre-distortion amplifier.

FIG. 2 shows a method of expanding the gain of the input signal at the pre-distortion device 100 to compensate for the gain saturation occurring at the power amplifier 120.

The pre-distortion device performs the operation of converting the digital input signal x(n) to y(n) as shown in equation (1) to compensate for the non-linearity of the power amplifier.

$$y(n) = \sum_m x(n-m) \cdot \sum_p w_p(m) \cdot |x(n-m)|^p + \quad (1)$$
$$\sum_{m_1,m_2} x(n-m_1) \cdot \sum_p w_p(m_1, m_2) \cdot |x(n-m_2)|^p +$$
$$\sum_{m_1,m_2,m_3} x(n-m_1) \cdot \sum_{p,q} w_{p,q}(m_1, m_2, m_3) \cdot |x(n-m_2)|^p \cdot |x(n-m_3)|^q$$

Here, x(n) denotes the input signal, y(n) denotes the output signal, m denotes memory depth, wp and wp,q denotes coefficients calculated through the adaptive algorithm, and p and q are involution values.

The first term of equation (1) is referred to as memory polynomial, which is widely used in the pre-distortion device. The second and third terms of equation (1) are modifications of the memory polynomial and expand the dimension of freedom of the pre-distortion device to improve performance.

The first and second terms of equation (1) may be implemented with the multiplier and adder or a lookup table. The lookup table is a digital memory device predefining the output signal depending on the input signal level and is a digital circuitry block appropriate for the operation defining the output value according to one input level.

In the case of using the lookup table, it is possible to decrease the complexity of the circuit by replacing the multiplier used in the pre-distortion device 100 with a lookup table. Since it is possible to express multiple terms using one lookup table, it is advantageous for the expandability of involution.

Equation (2) is a very simplified example for assisting the technology and includes the characteristics of the three terms of equation (1).

$$y(n) = x(n) \cdot \sum_p w_p(0, 0) \cdot |x(n)|^p + x(n) \cdot \sum_p w_p(0, 1) \cdot |x(n-1)|^p + \quad (2)$$
$$x(n) \cdot \{w(0, 1, 2) \cdot |x(n-1)| \cdot |x(n-2)|\}$$

Here, x(n) denotes the input signal, y(n) denotes the output signal, wp denotes the coefficient value calculated through the adaptive algorithm, and p denotes the involution value.

Figure 3:
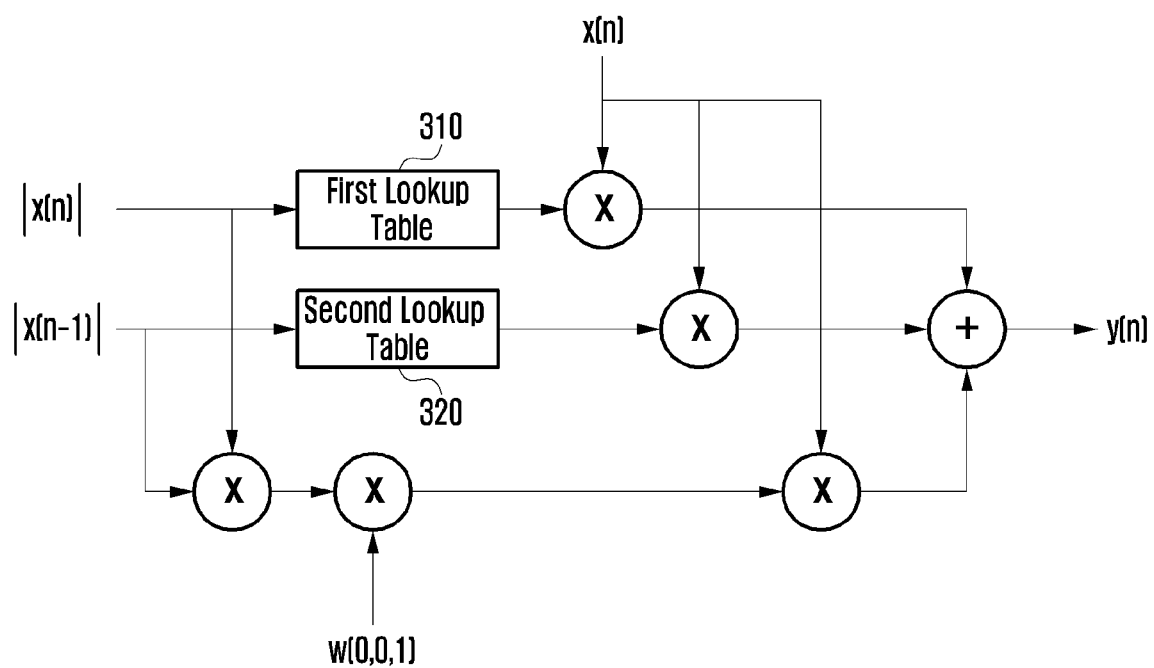
FIG. 3 is a circuit diagram illustrating a configuration of a normal pre-distortion apparatus.

FIG. 3 is a circuit diagram illustrating a configuration of the pre-distortion apparatus of equation (2) in a normal structure.

The first term of equation (2) includes an involution polynomial for an absolute value signal 1x(n)1 having the number of delays of 0. Similarly, the second term of equation (2) includes an involution polynomial for the absolute value signal 1x(n−1)1 having the number of delays of 1. The involution polynomial for the absolute value signal having one delay may be implemented with a lookup table having the input as the absolute value signal as shown in the upper part of FIG. 3. In this case, the lookup table stores the data for the output signal values corresponding to certain input signals having corresponding involutions.

In more detail, the lookup table is implemented such that the output signal corresponding to the input signal is determined as shown in equation (3).

$$\text{Output} = \sum_p w_p \cdot (\text{Input})^p \quad (3)$$

Here, Output denotes the output signal, Input denotes the input signal, and p denotes the involution.

As shown in equation (3) and FIG. 3, the use of lookup tables is capable of reducing the complexity of the circuit by replacing the multipliers of the pre-distortion apparatus. Since one lookup table is capable of expressing the sum of multiple terms as shown in equation (3), it is very advantageous for the expandability of involution.

Meanwhile, the third term of equation (2) includes multiplication of absolute value signal 1x(n)1 and Lx(n−1)1 having the non-identical number of delays. The formula of the multiplication of absolute value signals having the non-identical number of delays is implemented with the multipliers other than lookup table as shown in lower part of FIG. 3.

In this case, however, the use of the multipliers increases the circuit complexity of the pre-distortion apparatus as shown in FIG. 3. Unlike the case of using the lookup table, the same multiplier is used repeatedly to express the sum of multiple terms and this is disadvantageous in expandability.

The present invention has been conceived to solve the above problem and proposes a method capable of replacing the multipliers with a lookup table in the pre-distortion apparatus.

Figure 4:
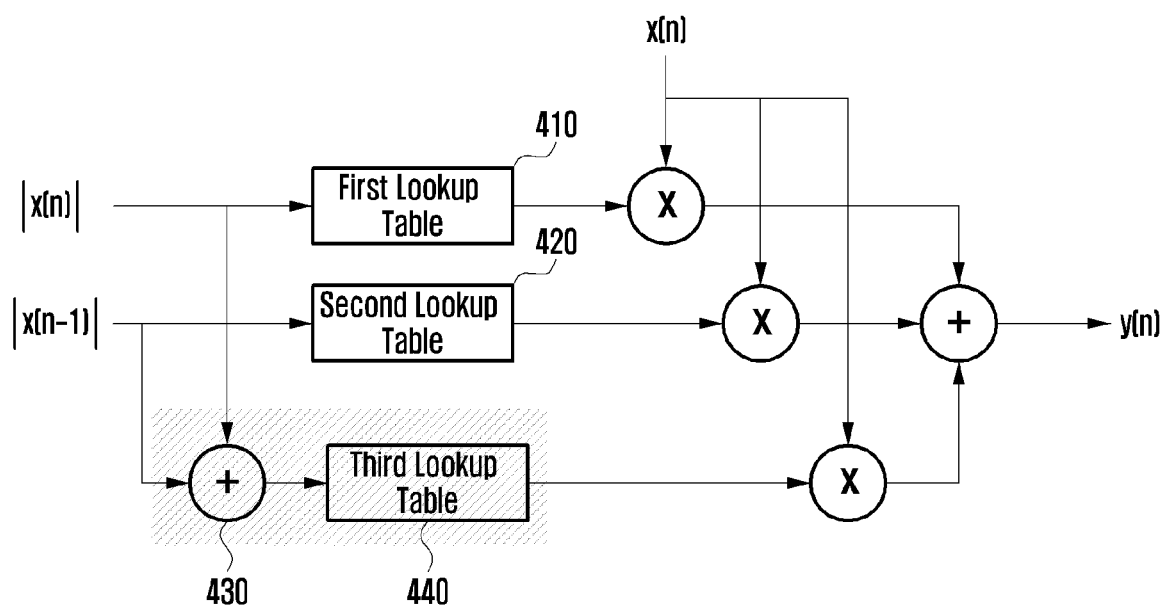
FIG. 4 is a circuit diagram illustrating a configuration of the pre-distortion apparatus according to an embodiment of the present invention.

FIG. 4 is a circuit diagram illustrating a configuration of the pre-distortion apparatus according to an embodiment of the present invention.

FIG. 4 shows a pre-distortion apparatus implemented by replacing the multipliers at the lower part of the conventional pre-distortion apparatus of FIG. 3 with an adder and a lookup table to perform the same operation. In detail, the two multipliers are substituted by an adder 430 and a lookup table 440.

By configuring the lookup tables of the pre-distortion apparatus of FIG. 4 appropriately, it is possible to implement a digital pre-distortion system outputting the same output signals as the pre-distortion apparatus of FIG. 3. With the newly added lookup table, it is possible to implement a digital pre-distortion system having the dimension of freedom higher than the conventional system.

In order to implement the digital pre-distortion system outputting the same output signal as the conventional pre-distortion apparatus, the third lookup table 400 added newly is implemented as equation (4).

$$\text{Output} = \frac{w(0, 0, 1)}{2} \cdot (\text{Input})^2 \quad (4)$$

Here, Output denotes the output signal, Input denotes the input signal, and w(0,0,1) denotes a constant determined through the adaptive algorithm at the coefficient determination step.

Equation (5) is derived by substituting the result of sum of 1x(n)1 and 1x(n−1)1 for the input signal of equation (4).

$$f(n) = \frac{w(0, 0, 1)}{2} \cdot \{|x(n)| + |x(n-1)|\}^2 \quad (5)$$
$$= \frac{w(0, 0, 1)}{2} \cdot \{|x(n)|^2 + 2|x(n)| \cdot |x(n-1)| + |x(n-1)|^2\}$$

$$= w(0, 0, 1) \cdot |x(n)| \cdot |x(n-1)| + \frac{w(0, 0, 1)}{2} \cdot |x(n)|^2 + \frac{w(0, 0, 1)}{2} \cdot |x(n-1)|^2$$

The formula expanded through equation (5) is a polynomial including a term of multiplication of the two signals 1x(n)1 and 1x(n−1)1 (first term) and respective involution terms (second and third terms).

Among the three terms of equation (5), the first term matches the signal intended to be acquired with the lookup table, and the rest two terms generated in involution to the sum of the two signals are to be removed. However, the rest two terms are linearly dependent on the terms implemented by the conventional first and second lookup tables 410 and 420. Accordingly, the second and third terms of equation (5) are may be removed by modifying the coefficients implementing the lookup tables 410 and 420.

The output signals f1(n) and f2(n) through the first and second lookup tables 310 and 320 of FIG. 3 may be expressed as equation (6).

$$f_1(n) = \sum_p w_p(0, 0) \cdot |x(n)|^p = w_0(0, 0) + \quad (6)$$
$$w_1(0, 0) \cdot |x(n)| + w_2(0, 0) \cdot |x(n)|^2 + w_3(0, 0) \cdot |x(n)|^3 + \ldots$$
$$f_2(n) = \sum_p w_p(0, 1) \cdot |x(n-1)|^p = w_0(0, 1) + w_1(0, 1) \cdot |x(n-1)| +$$
$$w_2(0, 1) \cdot |x(n-1)|^2 + w_3(0, 1) \cdot |x(n-1)|^3 + \ldots,$$

Here, x(n) denotes the input signal, wn denotes the coefficient calculated through the adaptive algorithm, p denotes the involution value, f1(n) denotes the signal output using the first lookup table, and f2(n) denotes the signal output using second lookup table.

Then, it is possible to make the output signal of the convention structure (using the multiplier) identical with the output signal of the structure proposed in the present invention (using an adder and a lookup table instead of the multiplier) by modifying equation (6) to equation (7).

$$f_1(n) = \sum_p w_p(0, 0) \cdot |x(n)|^p = w_0(0, 0) + w_1(0, 0) \cdot |x(n)| + \quad (6)$$
$$\left\{ w_2(0, 0) - \frac{w(0, 0, 1)}{2} \right\} \cdot |x(n)|^2 + w_3(0, 0) \cdot |x(n)|^3 + \ldots$$
$$f_2(n) = \sum_p w_p(0, 1) \cdot |x(n-1)|^p = w_0(0, 1) + w_1(0, 1) \cdot |x(n-1)| +$$
$$\left\{ w_2(0, 1) - \frac{w(0, 0, 1)}{2} \right\} \cdot |x(n-1)|^2 + w_3(0, 1) \cdot |x(n-1)|^3 + \ldots$$

Here, x(n) denotes the input signal, m denotes the memory depth, wn denotes the adaptive algorithm, and p denotes the involution value.

The pre-distortion apparatus depicted in FIG. 4 has the same output signals as the conventional pre-distortion apparatus of FIG. 3 and increases the dimension of freedom using the newly added third lookup table 440.

By modifying equation (4) expressing the operation formula of the newly added third lookup table 440 to the involution polynomial of the input signal as equation (8), it is possible to expand the dimension of freedom without change of the digital circuit.

Meanwhile, the operation formula of the lookup table expressed by equation (4) or modification the coefficient value from equation (6) to equation (7) is performed through the adaptive algorithm such as Least Mean Square (LMS) and Recursive Least Square (RLS). That is, if the adaptive algorithm determines the coefficient value for equation (8), it is possible for the pre-distortion apparatus of FIG. 4 to output the same signals as the digital pre-distortion apparatus of FIG. 3 without addition operation and change of circuit. Furthermore, since the dimension of freedom is expanded, it is possible to implement the pre-distortion apparatus having improved performance.

$$y(n) = x(n) \cdot \sum_p w_p(0, 0) \cdot |x(n)|^p + x(n) \cdot \sum_p w_p(0, 1) \cdot |x(n-1)|^p + \qquad (8)$$
$$x(n) \cdot \sum_p w_p(0, 1, 2) \cdot \{|x(n-1)| + |x(n-2)|\}^p$$

Here, x(n) denotes the input signal, y(n) denotes the output signal, wp denotes the coefficient calculated through the adaptive algorithm, and p denotes the involution value.

Figure 5:
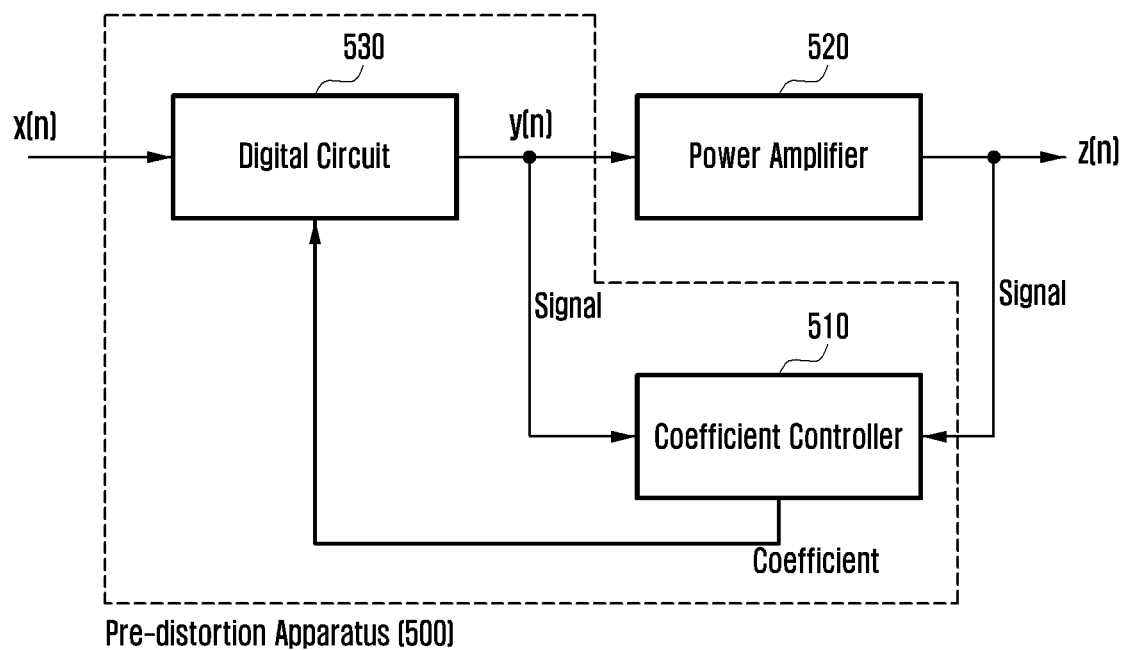
FIG. 5 is a block diagram illustrating configurations of a pre-distortion apparatus 500 and a power amplifier 520 connected to the pre-distortion apparatus according to an embodiment of the present invention.

FIG. 5 is a block diagram illustrating configurations of a pre-distortion apparatus 500 and a power amplifier 520 connected to the pre-distortion apparatus according to an embodiment of the present invention. As shown in FIG. 5, the pre-distortion apparatus 500 of the present invention includes a coefficient controller 510 and a digital circuit.

For explanation convenience, it is assumed that the signal input to the digital circuit 530 is x(n) and the signal output from the digital circuit 530 and input to the power amplifier 520 is y(n) and the signal output form the power amplifier 520 is z(n) in the following description.

Here, the signal y(n) output from the digital circuit 530 is the pre-distorted signal for compensating for the distortion of the power amplifier 520 and input to the power amplifier 520. The signal z(n) output from the power amplifier 520 is the signal compensated by the pre-distortion apparatus 500.

In order to determine the coefficient to be used in the digital circuit 530 (i.e. the coefficient set in the lookup table included in the digital circuit), the coefficient controller 510 measures the samples of the input signal y(n) and the output signal z(n) of the power amplifier 520.

The coefficient controller 520 may determine the coefficient to be applied to the digital circuit 530 based on the data of the adaptive algorithm such as LS, LMS, and RLS applied to the input signal y(n) and output signal z(n). In this case, since the coefficient determined by the coefficient controller 510 has to have the characteristic of inversely compensating the feature of the power amplifier 520, the power amplifier input signal sample is used as the target data of the adaptive algorithm and the power amplifier output signal sample as the input data of the adaptive algorithm.

The coefficient controller 510 searches for the coefficient minimizing the difference between the involution to the sum of the first absolute input signal 1z(n)1 having the first number of delays (e.g. 0) to z(n) as the output signal of the power amplifier 520 and the second absolute input signal 1z(n−1)1 having the second number of delays (e.g. 1) and the input signal y(n) of the power amplifier 520 and sets the coefficient in the digital circuit 530 (particularly, the lookup table). The coefficient controller 510 may find the coefficient value, which is calculated using equation (7), using the adaptive algorithm without extra calculation.

Meanwhile, the digital circuit 530 includes an adder and a lookup table connected to the adder directly.

The adder receives 1x(n)1 and 1x(n−1)1 having the first number of delays (e.g. 0) and the second number of delays (e.g. 1) respectively to absolute value of the input signal x(n) and outputs 1x(n)1+1x(n−1)1 as the sum of those signals. Then, the lookup table included in the digital circuit 530 outputs the value preset by the coefficient controller 510 based on the input of 1x(n)1+1x(n−1)1 as the output signal of the adder.

Since the signal output from the digital circuit 530 is the signal pre-distorted by the feature of the pre-distortion apparatus 500, it is possible to acquire the intended signal by inputting the output signal of the digital circuit 530 to the power amplifier 520.

Figure 6:
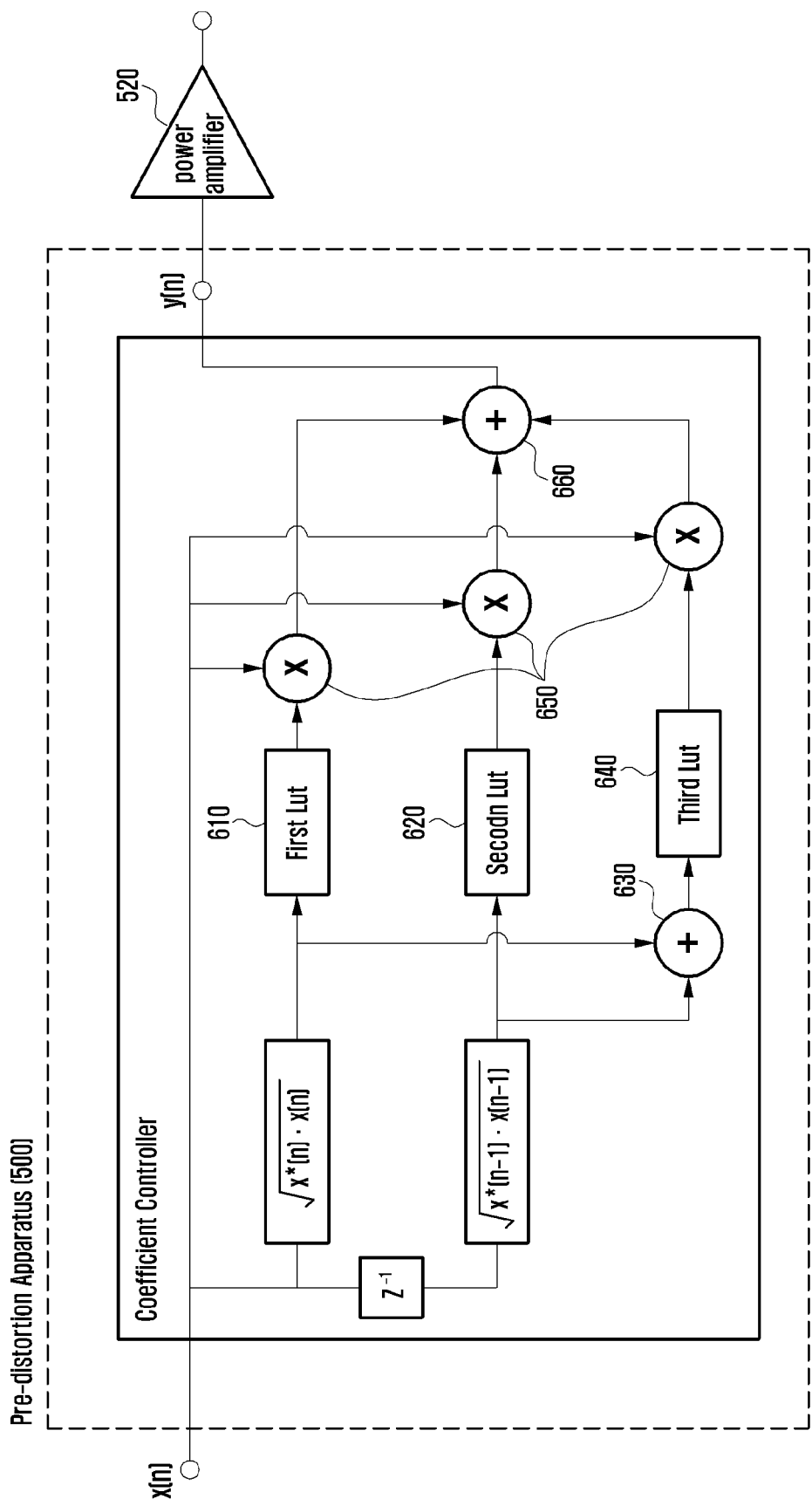
FIG. 6 is a circuit diagram illustrating a configuration of the digital circuit of the pre-distortion apparatus according to an embodiment of the present invention.

FIG. 6 is a circuit diagram illustrating exemplary operation of the pre-distortion apparatus 500 of FIG. 5 according to an embodiment of the present invention.

According to the exemplary operation depicted in FIG. 6, the pre-distortion apparatus 500 of the present invention may include a first lookup table 610, a second lookup table 620, a first adder 630, a third lookup table 640, multipliers 650, a second adder 660.

The input signal x(n) is delayed as long as the first number of delays and then converted to a first absolute input signal through absolute signal process. The first absolute input signal is input to the first lookup table 610 and the first adder 630. At the same time, the input signal x(n) is delayed as much as the second number of delays and then processed into the second absolute input signal. The second absolute input signal is input to the second lookup table 620 and the first adder 630.

In FIG. 6, it is assumed that the first number of delays is 0 and the second number of delays is 1.

The first lookup table 610 generates an involution of the first absolute input signal multiplied by the first coefficient to the multiplier 650. At this same time, the second lookup table 620 generates the involution of the second absolute signal multiplied by the second coefficient.

The first adder 630 sums the first absolute input signal and the second absolute signal to generate the third absolute input signal to the third lookup table 640. Then the third lookup table 640 generates the involution of the third absolute input signal multiplied by the third coefficient to the multiplier 650.

The second adder 660 sums the signals output from the multipliers 650 to generate a output signal y(n) to the power amplifier 520.

Figure 7:
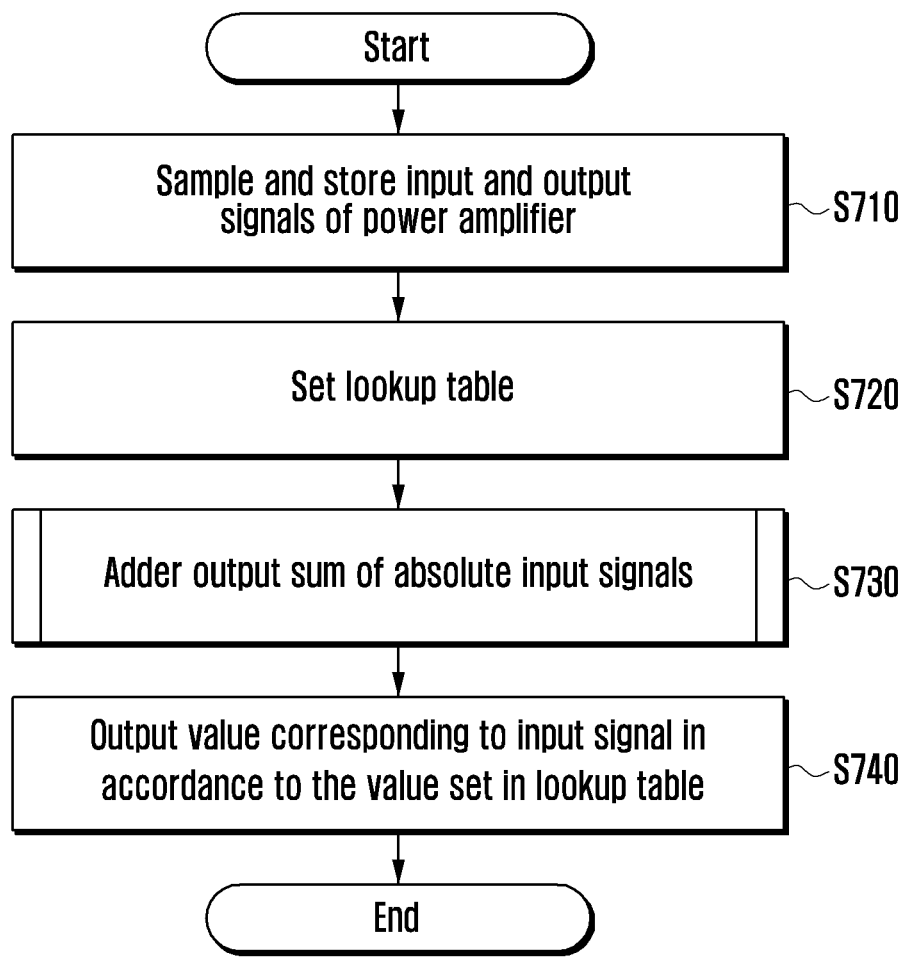
FIG. 7 is a flowchart illustrating a signal distortion compensation procedure of the pre-distortion apparatus for compensating for the distortion of the input signal according to an embodiment of the present invention.

FIG. 7 is a flowchart illustrating a signal distortion compensation procedure of the pre-distortion apparatus for compensating for the distortion of the input signal according to an embodiment of the present invention.

The coefficient controller 510 of the pre-distortion apparatus 500 performs sampling on the input and output signals of the power amplifier 520 and stores the sampling results at step S710. The sampled input and output signal values are used as the basic data for the pre-distortion apparatus 110 to compensate for the distortion of the input signal.

The coefficient controller 510 determines the coefficient minimizing distance between the involution of the sum of the first absolute output signal having the first number of delays for the absolute signal of the power amplifier output signal and the second absolute output signal having the second number of delays and the input signal of the power amplifier and sets the lookup table with the coefficient at step S720.

The adder of the pre-distortion apparatus 500 receives the first absolute input signal having the first number of delays for the absolute signal of the power amplifier input signal and the second absolute input single having the second number of delays and outputs the sum of the first and second absolute input signals at step S730.

Then the lookup table connected to the adder output a result value according to the coefficient set in correspondence to the sum of the first and second absolute input signals at step S740.

If an extra process is necessary according to the feature of the pre-distortion apparatus, the signal output from the lookup table is processed and then input to the power amplifier.

As described above, the present invention provides a digital pre-distortion apparatus implemented with adders and lookup table that is capable of outputting the same signal as the conventional pre-distortion apparatus. Also, the digital pre-distortion apparatus of the present invention is capable of expanding the dimension of freedom of the digital pre-distortion apparatus.

Although preferred embodiments of the invention have been described using specific terms, the specification and drawings are to be regarded in an illustrative rather than a restrictive sense in order to help understand the present invention. It is obvious to those skilled in the art that various modifications and changes can be made thereto without departing from the broader spirit and scope of the invention.

The invention claimed is:

1. A digital pre-distortion apparatus comprising:
a coefficient controller which sets a lookup table with a coefficient minimizing difference between an involution of sum of a first absolute output signal having a first number of delays and a second absolute output signal having a second number of delays for an absolute signal of a power amplifier output signal and an input signal of the power amplifier;
an adder which receives a first absolute input signal having the first number of delays and a second absolute input signal having the second number of delays for the absolute signal of a digital pre-distortion apparatus input signal and outputs a sum of the first and second absolute input signals; and
a lookup table which connects to the adder and outputs a result value according to the coefficient set in correspondence to the sum of the first and second absolute input signals.

2. The apparatus of claim 1, wherein the adder and the lookup table is connected in series.

3. A digital pre-distortion method comprising:
sampling output signal and input signal of a power amplifier;
setting a lookup table with a coefficient minimizing difference between an involution of sum of a first absolute output signal having a first number of delays and a second absolute output signal having a second number of delays for an absolute signal of a power amplifier output signal and an input signal of the power amplifier;
receiving a first absolute input signal having the first number of delays and a second absolute input signal having the second number of delays for the absolute signal of a digital pre-distortion apparatus input signal and outputting a sum of the first and second absolute input signals; and
outputting a result value according to the coefficient set in correspondence to the sum of the first and second absolute input signals.

4. The method of claim 3, wherein the adder and the lookup table is connected in series.

* * * * *